United States Patent
Yin

(10) Patent No.: US 12,471,331 B2
(45) Date of Patent: Nov. 11, 2025

(54) FIELD EFFECT TRANSISTOR AND PREPARATION METHOD THEREOF, AND SEMICONDUCTOR STRUCTURE

(71) Applicant: HUAWEI TECHNOLOGIES CO., LTD., Guangdong (CN)

(72) Inventor: Wen Yin, Shenzhen (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 441 days.

(21) Appl. No.: 18/069,800

(22) Filed: Dec. 21, 2022

(65) Prior Publication Data

US 2023/0132748 A1    May 4, 2023

Related U.S. Application Data

(63) Continuation of application No. PCT/CN2021/102239, filed on Jun. 25, 2021.

(30) Foreign Application Priority Data

Jun. 28, 2020  (CN) .......................... 202010599782.0
Aug. 28, 2020  (CN) .......................... 202010888184.5

(51) Int. Cl.
 H01L 29/06  (2006.01)
 H10D 62/10  (2025.01)

(52) U.S. Cl.
 CPC ......... *H10D 62/121* (2025.01); *H10D 62/102* (2025.01)

(58) Field of Classification Search
 CPC ............... H10D 62/121; H10D 62/102; H10D 30/6757; H10D 30/6741; H10D 30/021;
 (Continued)

(56) References Cited

U.S. PATENT DOCUMENTS

2002/0173083 A1 * 11/2002 Avouris ............... H10K 10/466
  438/105
2008/0290418 A1 * 11/2008 Kalburge ........... H10D 84/0188
  257/E21.632
(Continued)

FOREIGN PATENT DOCUMENTS

CN   101520430 A    9/2009
CN   102280480 A   12/2011
(Continued)

OTHER PUBLICATIONS

Willems et al., "Control of the outer diameter of thin carbon nanotubes synthesized by catalytic decomposition of hydrocarbons," Chemical Physics Letters, Jan. 28, 2000, 6 pages.
(Continued)

*Primary Examiner* — Tong-Ho Kim
(74) *Attorney, Agent, or Firm* — Fish & Richardson P.C.

(57) ABSTRACT

A field effect transistor and a preparation method thereof, and a semiconductor structure are provided. An example field effect transistor includes: a substrate structure, a source, a drain, and a gate. The source and the drain are arranged on the substrate structure in a first direction, and a channel region is formed between the source and the drain. A channel layer is formed in the channel region, and N carbon nanotubes extending in the first direction are embedded in the channel layer, where N is an integer greater than or equal to 1. Two ends of each of the N carbon nanotubes are respectively connected to the source and the drain to form a conductive path. The gate is formed on the channel layer. In
(Continued)

the channel region between the source and the drain, electron conduction is implemented by using the carbon nanotube disposed in the channel layer.

20 Claims, 12 Drawing Sheets

(58) Field of Classification Search
CPC .... H10D 62/10; H10D 62/124; H10D 62/235; H10D 30/60; H10K 10/484; H10K 85/221; H10K 10/491; H10K 10/468; H10K 10/84; H10K 71/10; B82Y 10/00
USPC .......................................................... 257/213
See application file for complete search history.

(56) References Cited

U.S. PATENT DOCUMENTS

| | | | |
|---|---|---|---|
| 2009/0256175 | A1 | 10/2009 | Kim et al. |
| 2017/0162702 | A1* | 6/2017 | Hu ........................ H10D 64/689 |

FOREIGN PATENT DOCUMENTS

| | | | |
|---|---|---|---|
| CN | 105551968 | A | 5/2016 |
| CN | 105609636 | A | 5/2016 |
| CN | 107706307 | B | 5/2020 |
| KR | 20040094179 | A * | 11/2004 |
| KR | 20130137140 | A | 12/2013 |

OTHER PUBLICATIONS

Feng et al., "Chirality-specific growth of single-walled carbon nanotubes on solid alloy catalysts," Nature, vol. 510, Jun. 26, 2014, 13 pages.
Yu et al., "Majority Carrier Type Conversion with Floating Gates in Carbon Nanotube Transistors," Advanced Materials, vol. 21, No. 47, Aug. 12, 2009, 4 pages.
Shulaker et al., "Monolithic three-dimensional integration of carbon nanotube FETs with silicon CMOS," 2015 Symposium on VLSI Technology, Jun. 9, 2014, 2 pages.
Extended European Search Report in European Appln No. 21833943. 0, dated Oct. 10, 2023, 10 pages.
International Search Report and Written Opinion in International Appln. No. PCT/CN2021/102239, mailed on Sep. 26, 2021, 13 pages (with English translation).
Office Action in Korean Appln. No. 10-2023-7001602, mailed on Nov. 18, 2024, 13 pages (with English translation).
Ren et al., "Surface structures of sodium borosilicate glasses from molecular dynamics simulations," Journal of the American Ceramic Society, vol. 100, No. 6, Mar. 20, 2017, pp. 2516-2524.
EP Communication Pursuant to Article 94(3) EPC in European Appln. No. 21833943.0, mailed on Jan. 27, 2025, 4 pages.

* cited by examiner

FIELD EFFECT TRANSISTOR AND PREPARATION METHOD THEREOF, AND SEMICONDUCTOR STRUCTURE

CROSS-REFERENCE TO RELATED APPLICATIONS

This application is a continuation of International Application No. PCT/CN2021/102239, filed on Jun. 25, 2021, which claims priority to Chinese Patent Application No. 202010599782.0, filed on Jun. 28, 2020, and Chinese Patent Application No. 202010888184.5, filed on Aug. 28, 2020. All of the aforementioned patent applications are hereby incorporated by reference in their entireties.

TECHNICAL FIELD

This application relates to the field of semiconductors, and in particular, to a field effect transistor and a preparation method thereof, and a semiconductor structure.

BACKGROUND

A transistor used in an existing integrated circuit is usually an FET (Field Effect Transistor). Using the FET shown in FIG. 1 as an example, a structure of the FET includes a silicon substrate 1', a source 2', a drain 3', and a gate 4'. A channel region 5' is formed between the source 2' and the drain 3', and a current flowing through the channel region 5' between the source 2' and the drain 3' is a source-drain current. The source-drain current herein is controlled by a voltage of the gate 4', and a width of the channel region 5' affects flow of the source-drain current and performance of the FET.

Currently, an electronic device develops to be miniaturized, light, and thin. However, it is difficult to miniaturize a conventional transistor beyond 1 nm due to a restriction of a silicon process. Therefore, a new transistor structure that is further miniaturized on a basis of meeting performance is required.

SUMMARY

This application provides a field effect transistor and a preparation method thereof, and a semiconductor structure, to facilitate component miniaturization.

According to a first aspect, this application provides a field effect transistor, specifically including a substrate structure, a source, a drain, and a gate. The substrate structure is located at a bottom of the entire transistor structure, to provide bearing support and protection for the entire structure. The source and the drain are arranged on the substrate structure in a first direction, a gap is formed between the source and the drain, and the gap is a channel region. A channel layer is formed in the channel region, and N carbon nanotubes extending in the first direction are embedded in the channel layer, where N is an integer greater than or equal to 1. Because the carbon nanotubes all extend in the first direction, when N is greater than 1, it indicates that the carbon nanotubes are parallel to each other. Two ends of each of the N carbon nanotubes are respectively connected to the source and the drain to form a conductive path, to implement current conduction between the source and the drain. An extension direction of the carbon nanotube is a direction of an axis of the carbon nanotube, so that a conduction distance of a current between the source and the drain is the shortest. The gate is formed on the channel layer, and is configured to control a degree of electron flow between the source and the drain.

For the field effect transistor, in the channel region between the source and the drain, electron conduction between the source and the drain is implemented by using the carbon nanotube disposed in the channel layer. Excellent electrical conductivity of the carbon nanotube enables the field effect transistor to have a wider channel, in other words, the field effect transistor has a larger drive current with stronger performance. The carbon nanotube is in a shape of a tiny cylinder formed by arranging carbon atoms, which helps implement component miniaturization.

Specifically, in a direction from the gate to the channel layer, a capacitive layer and a gate dielectric layer are further stacked between the gate and the channel layer. The substrate structure may include a silicon substrate and a well region formed on the silicon substrate. The well region herein may be a P well or an N well. In specific implementation, polarities of the source and the gate need to correspond to a polarity of the well region. In addition, to prevent electric leakage, the substrate structure further includes an insulation layer disposed on a side that is of the well region and that is away from the silicon substrate, and the source and the drain are located on the insulation layer.

When a quantity of the foregoing carbon nanotubes is greater than 2, the N carbon nanotubes may be distributed in the channel layer in an array, which facilitates batch preparation of the carbon nanotubes.

In a possible implementation, in consideration of a distribution status of carbon nanotubes in the channel layer, a structure of the channel layer may include at least one channel interlayer, each channel interlayer includes a first oxide layer and a second oxide layer that are stacked in a direction from the substrate structure to the channel layer, and at least one carbon nanotube is embedded between the first oxide layer and the second oxide layer. The channel layer is divided into upper and lower parts, thereby facilitating the preparation of carbon nanotubes.

To increase a preparation yield of the carbon nanotubes, a metal silicate compound may be formed on a surface that is of the first oxide layer and that is in contact with the carbon nanotube, or a metal oxide may be formed on a surface that is of the first oxide layer and that is in contact with the carbon nanotube. Both the metal silicate compound and the metal oxide facilitate formation of the carbon nanotube.

As contact between the carbon nanotube and the source and between the carbon nanotube and the drain affects conductivity, in a possible implementation, a first contact layer is disposed on a side that is of the source and that faces the channel layer, a second contact layer is disposed on a side that is of the drain and that faces the channel layer, two ends of the carbon nanotube are respectively connected to the first contact layer and the second contact layer, and the carbon nanotube may be connected to the first contact layer and the second contact layer in a surface contact or extension manner. Conductivity of the first contact layer is higher than conductivity of the source, and conductivity of the second contact layer is higher than conductivity of the drain, so that conductivity of a connection between the carbon nanotube and the source and conductivity of a connection between the carbon nanotube and the drain can be improved. This helps improve electron conduction between the source and the drain. A material of the first contact layer may be gold or a gold alloy, and a material of the second contact layer may also be gold or a gold alloy.

According to a second aspect, based on the structure of the field effect transistor, this application further provides a semiconductor structure. The semiconductor structure includes two field effect transistors, and the two field effect transistors are isolated from each other by using an isolator.

According to a third aspect, based on the foregoing structure of the field effect transistor, this application further provides a preparation method for a field effect transistor, including the following steps:

preparing a substrate structure;

preparing a channel layer on the substrate structure, where N carbon nanotubes extending in a first direction are embedded in the channel layer, two ends of the carbon nanotube are exposed from the channel layer, and N is an integer greater than or equal to 1;

forming a gate on the channel layer; and forming a source and a drain respectively on two sides of the channel layer, where the source and the drain are respectively connected to the two ends of the carbon nanotube to form a conductive path.

The preparing a channel layer on the substrate structure includes the following steps performed at least once:

forming a first oxide layer on a base material, where the base material is a structure that is of the substrate structure and that is used to form a side of the channel layer;

forming at least one carbon nanotube on the first oxide layer; and forming a second oxide layer on a surface of the carbon nanotube to cover the carbon nanotube.

The forming at least one carbon nanotube on the first oxide layer can adopt at least the following two implementations.

In a possible implementation, after the forming a first oxide layer on a base material and before the forming at least one carbon nanotube on the first oxide layer, the method further includes the following step:

preparing a metal oxide on the first oxide layer, so that the metal oxide reacts with the oxide layer to form a metal silicate compound.

The forming at least one carbon nanotube on the first oxide layer includes the following step:

synthesizing the carbon nanotube on the metal silicate compound by using a vapor deposition method under an action of a catalyst. The catalyst herein may be tungsten-based alloy nanocrystalline.

In another possible implementation, after the forming a first oxide layer on a base material and before the forming at least one carbon nanotube on the first oxide layer, the method further includes the following step:

adding metal to the first oxide layer to form a metal oxide, and then forming a carbon nanotube on the metal oxide.

In a possible implementation, a first contact layer is disposed on a side that is of the source and that faces the channel layer, a second contact layer is disposed on a side that is of the drain and that faces the channel layer, one end of the carbon nanotube is connected to the source by using the first contact layer, and the other end of the carbon nanotube is connected to the drain by using the second contact layer. Conductivity of the first contact layer is higher than conductivity of the source, and conductivity of the second contact layer is higher than conductivity of the drain.

Before the preparing a channel layer in which at least one carbon nanotube is embedded on the substrate structure, and forming a gate on the channel layer, the method further includes the following step:

depositing high-conductivity metal on the two sides of the channel layer to form the first contact layer and the second contact layer on the two sides of the channel layer, where the two ends of the carbon nanotube are respectively connected to the first contact layer and the second contact layer. A process of depositing the high-conductivity metal on the two sides of the channel layer may use electron beam lithography.

When the source and the drain are prepared after this step, the first contact layer is connected to the source, and the second contact layer is connected to the drain.

In a possible implementation, in a direction from the gate to the channel layer, a gate dielectric layer and a capacitive layer are further stacked between the gate and the channel layer, and the forming a gate on the channel layer includes the following steps:

preparing the gate dielectric layer on the channel layer;

preparing the capacitive layer on the gate dielectric layer; and preparing the gate on the capacitive layer.

In a possible implementation, the substrate structure includes a silicon substrate and a well region formed on the silicon substrate, and the preparing a substrate structure includes the following step:

doping an impurity on the silicon substrate to form the well region.

When the substrate structure further includes an insulation layer formed on a side that is of the well region and that is away from the silicon substrate, and after the doping an impurity on the silicon substrate to form the well region, the method further includes the following step:

forming the insulation layer on a side that is of the well region and that is away from the silicon substrate.

DESCRIPTION OF EMBODIMENTS

An application scenario of this application is first described. Currently, a size of a conventional transistor cannot adapt to a development trend of miniaturization, lightness, and thinning of an electronic device due to a process limitation. Therefore, embodiments of this application provide a field effect transistor and a preparation method thereof, and a semiconductor structure. Such a field effect transistor has stronger performance and a larger drive current, and can meet a development requirement of miniaturization of the electronic device.

To make the objectives, technical solutions, and advantages of this application clearer, the following further describes this application in detail with reference to the accompanying drawings.

Terms used in the following embodiments are merely for the purpose of describing specific embodiments, but are not intended to limit this application. The terms "one", "a", "the", "the foregoing", "this", and "the one" of singular forms used in the specification and the appended claims of this application are also intended to include expressions such as "one or more", unless otherwise specified in the context clearly.

Referring to "an embodiment" or "some embodiments" or the like in the specification means that one or more embodiments of this application include a specific feature, structure, or characteristic described with reference to the embodiment. Therefore, statements such as "in an embodiment", "in some embodiments", "in some other embodiments", and "in other embodiments" that appear at different places in this specification do not necessarily mean referring to a same embodiment. Instead, the statements mean "one or more but not all of the embodiments", unless otherwise specifically emphasized in another manner. The terms "include", "contain", "have", and their variants all mean "include but are not limited to", unless otherwise specifically emphasized in another manner.

Figure 1:
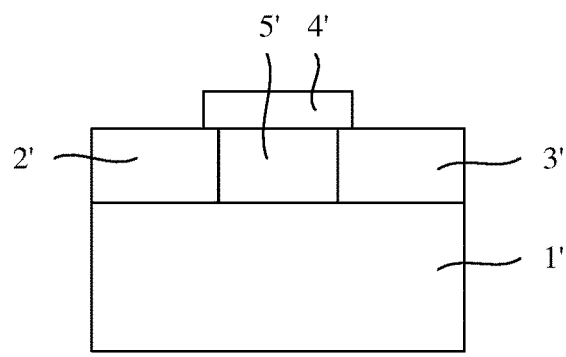
FIG. 1 is a schematic diagram of a structure of a field effect transistor in the conventional technology.
Figure 2A:
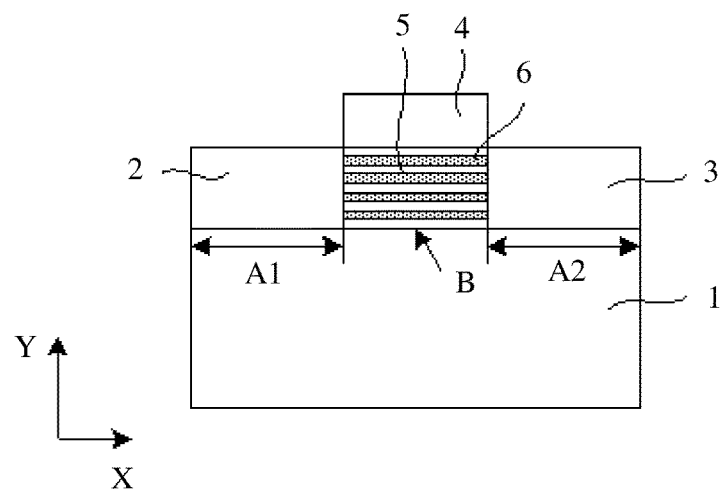
FIG. 2a to FIG. 2f are schematic diagrams of a structure of a field effect transistor according to an embodiment of this application.

FIG. 2a is a schematic diagram of a structure of a field effect transistor according to an embodiment of this application. The field effect transistor includes a substrate structure 1, a source 2, a drain 3, and a gate 4. In a Y direction shown in FIG. 2a, the substrate structure 1 is located at a bottom of the entire transistor structure, a top of the substrate structure 1 is divided into a first area A1 and a second area A2, and there is a spacing between the first area A1 and the second area A2. The source 2 is correspondingly disposed in the first area A1, the drain 3 is correspondingly disposed in the second area A2, space is formed between the source 2 and the drain 3, the space is set as a channel region B, and the gate 4 is correspondingly located above the channel region B. A channel layer 5 is formed in the channel region B, and a plurality of carbon nanotubes 6 are embedded in the channel layer 5. Herein, structures of the channel layer 5 and the carbon nanotubes 6 are shown in a local section. The plurality of carbon nanotubes 6 herein are distributed in parallel. As shown in FIG. 2a, each carbon nanotube 6 extends in a first direction (that is, an X direction in FIG. 2a, where the X direction is perpendicular to the Y direction), an axis of any carbon nanotube 6 is parallel to the X direction, and two ends of each carbon nanotube 6 are respectively connected to the source 2 and the drain 3, so as to implement current conduction between the source 2 and the drain 3. It should be understood that a quantity of carbon nanotubes 6 herein is N, where N is an integer greater than or equal to 1. A plurality of carbon nanotubes are shown in FIG. 2a. When there is only one carbon nanotube 6, an effect of conducting the source 2 and the drain 3 may also be implemented, and when there are a plurality of carbon nanotubes 6, electron circulation efficiency between the source 2 and the drain 3 may be enhanced. The carbon nanotube 6 is connected to the source 2 and the drain 3 in a direct contact connection manner to implement circuit conduction. Certainly, a contact medium may be further added to implement circuit conduction in an indirect connection manner.

Figure 2B:
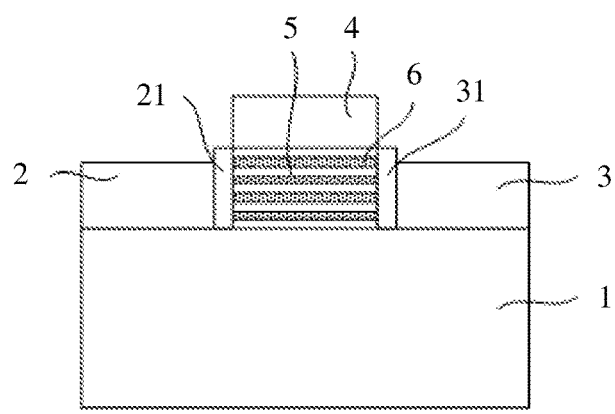

In a possible implementation, in a structure of a field effect transistor shown in FIG. 2b, disposing a first contact layer 21 on a side that is of the source 2 and that faces the channel region B is equivalent to disposing the first contact layer 21 between the source 2 and the channel layer 5, so that the source 2 and the channel layer 5 are connected by using the first contact layer 21. An end that is of the carbon nanotube 6 embedded in the channel layer 5 and that faces the source 2 may be in contact with the first contact layer 21 or extend into the first contact layer 21. Correspondingly, disposing a second contact layer 31 on a side that is of the drain 3 and that faces the channel region B is equivalent to implementing a connection between the drain 3 and the channel layer 5 by using the second contact layer 31, and an end that is of the carbon nanotube 6 embedded in the channel layer 5 and that faces the drain 3 may be in contact with the second contact layer 31 or extend into the second contact layer 31.

The first contact layer 21 and the second contact layer 31 herein are equivalent to a contact medium between the source 2, the drain 3, and the carbon nanotube 6. Conductivity of the first contact layer 21 is higher than conductivity of the source 2, and conductivity of the second contact layer 31 is higher than conductivity of the drain 3. Therefore, the first contact layer 21 and the second contact layer 31 can improve conductivity between the source 2 and the carbon nanotube 6, and conductivity between the drain 3 and the carbon nanotube 6.

Specifically, a material of the first contact layer 21 may be gold or a gold alloy, and the gold alloy may be an alloy doped with copper or cobalt. Such a material is selected because the gold or the gold alloy has high conductivity in terms of electrical contact. In addition, the gold or gold alloy has good ductility in terms of preparation, facilitates process preparation, and has good contact. Similarly, a material of the second contact layer 31 may be also gold or a gold alloy.

A structure of the field effect transistor shown in FIG. 2b is used as an example. The substrate structure 1 may be specifically shown in FIG. 2c. The substrate structure 1 includes a silicon substrate 11 and a well region 12 formed on the silicon substrate 11. The silicon substrate 11 is located at a bottommost layer of the entire field effect transistor structure, to provide bearing and support for the entire field effect transistor, and also protect the structure of the field effect transistor. The well region 12 may be a P well or an N well. It should be understood that, when the well region 12 is the P well, the source 2 and the drain 3 should be N-type doped structures; or when the well region 12 is the N well, the source 2 and the drain 3 should be P-type doped structures. FIG. 2b illustrates a structure in which the well region 12 is the P well, and the source 2 and the drain 3 are the N-type doped structures.

Figure 2C:
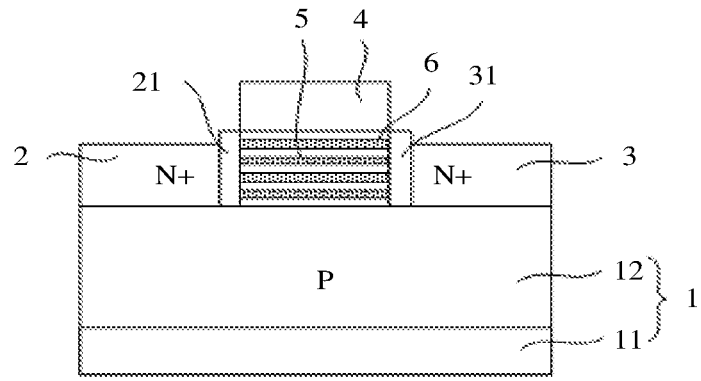
Figure 2D:
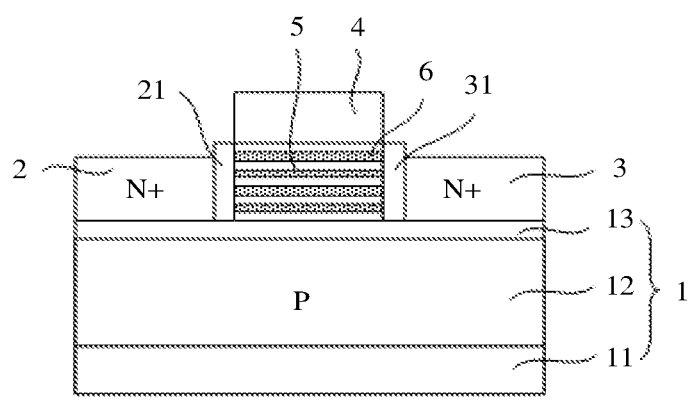

Based on the structure of the field effect transistor shown in FIG. 2c, FIG. 2d shows a structure of another field effect transistor. A difference from the structure of the field effect transistor shown in FIG. 2c lies in that an SOI (silicon-on-insulator, silicon technology) is used to form an insulation layer 13 on a surface that is of the well region 12 and that is away from the silicon substrate 11, and the insulation layer 13 may be $SiO_2$. Both the source 2 and the drain 3 are disposed on the insulation layer 13. The insulation layer 13 can reduce a parasitic capacitance between the source 2, the drain 3 and the well region 12, thereby achieving an anti-leakage effect.

Figure 2E:
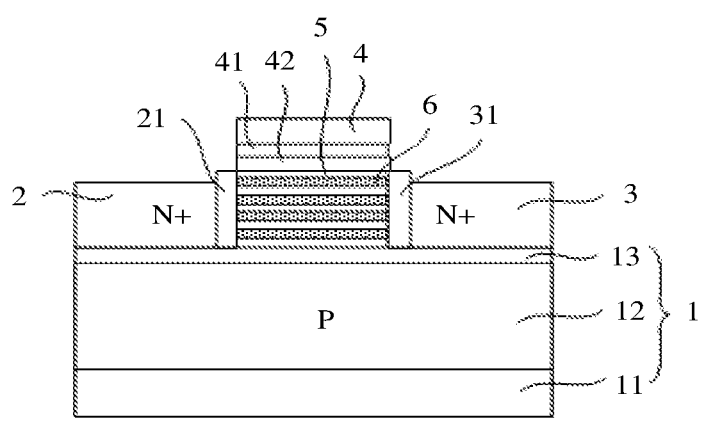

In the field effect transistor shown in FIG. 2e, in a direction from the gate 4 to the channel layer 5, a capacitive layer 41 and a gate dielectric layer 42 are stacked between the gate 4 and the channel layer 5, the capacitive layer 41 is in contact with the gate 4, and the gate dielectric layer 42 is in contact with the channel layer 5.

Figure 2F:
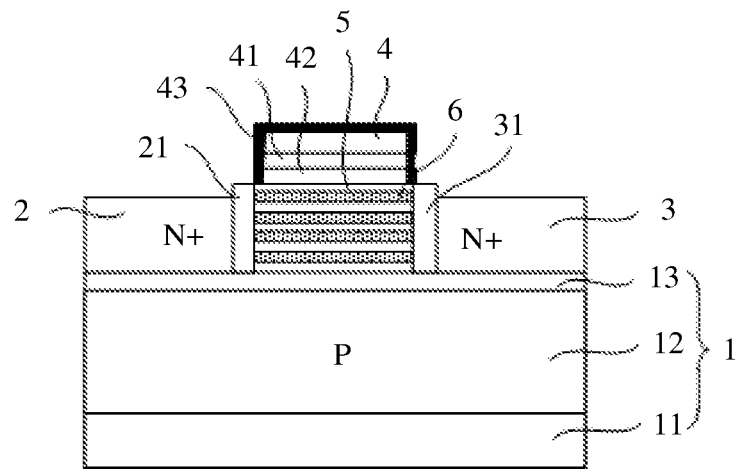

Based on the structure of the field effect transistor shown in FIG. 2e, an embodiment of this application further provides a field effect transistor. As shown in FIG. 2f, a surface of a structure including the gate 4, the capacitive layer 41, and the gate dielectric layer 42 is covered with a first protective layer 43, and the first protective layer 43 may be nitride.

It should be noted that, in the field effect transistor shown in FIG. 2a to FIG. 2f, the silicon substrate 11, the well region 12, and the insulation layer 13 are referred to as the substrate structure 1 as an entire structure, and are divided only by using positions of the structures in the field effect transistor structure. The concept of the substrate structure 1 is merely used to describe positions for disposing the silicon substrate 11, the well region 12, and the insulation layer 13. It is not used to limit a specific function of the three-layer structure. It should be understood that, based on understanding of the substrate structure 1, the substrate structure 1 may further include another structure in which the field effect transistor is located in a part of the substrate structure 1 and that is not shown in this embodiment of this application.

Figure 3A:
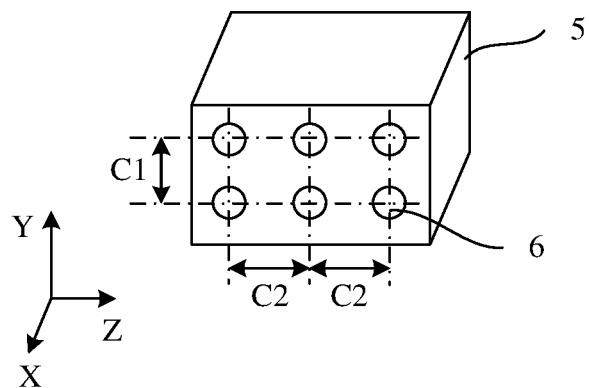
FIG. 3a to FIG. 3d are schematic diagrams of a distribution manner of carbon nanotubes in a channel layer in a field effect transistor according to an embodiment of this application.

A distribution manner shown in FIG. 3a is used as an example of the plurality of carbon nanotubes 6. In FIG. 3a, there are six carbon nanotubes 6, and the carbon nanotubes 6 are divided into an upper layer and a lower layer in a Y direction. A distance between the two layers of carbon nanotubes 6 is C1 (using an axis of the carbon nanotube 6 as a reference). In a Z direction, three carbon nanotubes 6 on the upper layer are disposed side by side, a distance between any two adjacent carbon nanotubes 6 is C2 (using the axis of the carbon nanotube 6 as the reference), three carbon nanotubes 6 on the lower layer are disposed side by side, and a distance between any two adjacent carbon nanotubes 6 is also C2 (using the axis of the carbon nanotube 6 as the reference). C1 may be equal to C2, or C1 may be unequal to C2. In this distribution, it is set that the direction Y is a column direction, and the direction Z is a row direction. In FIG. 3a, the carbon nanotubes 6 are aligned left and right in the row direction, and are aligned up and down in the column direction. In addition, in the row direction, a distance between any two carbon nanotubes 6 is equal.

Figure 3B:
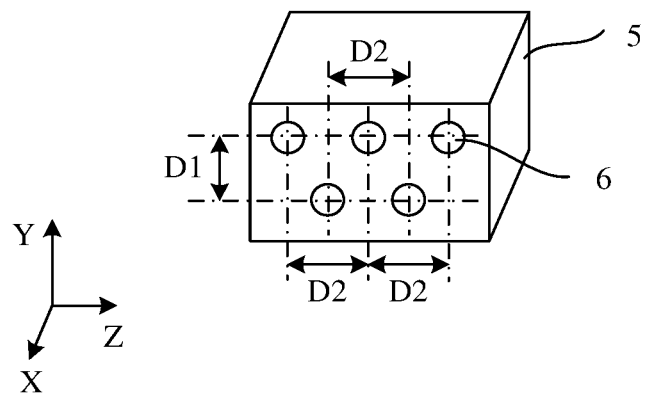

FIG. 3b shows another possible distribution manner of carbon nanotubes 6. There are five carbon nanotubes 6, which are divided into an upper layer and a lower layer in a Y direction. A distance between the two layers of carbon nanotubes 6 is D1 (using an axis of the carbon nanotube 6 as a reference). In a Z direction, three carbon nanotubes 6 on the upper layer are disposed side by side, a distance between any two adjacent carbon nanotubes 6 is D2 (using the axis of the carbon nanotube 6 as the reference), two carbon nanotubes 6 on the lower layer are disposed side by side, and a distance between any two adjacent carbon nanotubes 6 is also D2 (using the axis of the carbon nanotube 6 as the reference). D1 may be equal to D2, or D1 may be unequal to D2. In this distribution, it is set that the direction Y is a column direction, and the direction Z is a row direction. In FIG. 3b, the carbon nanotubes 6 are aligned left and right in the row direction, and are mutually misaligned in the column direction. In addition, in the row direction, a distance between any two carbon nanotubes 6 is equal.

Figure 3C:
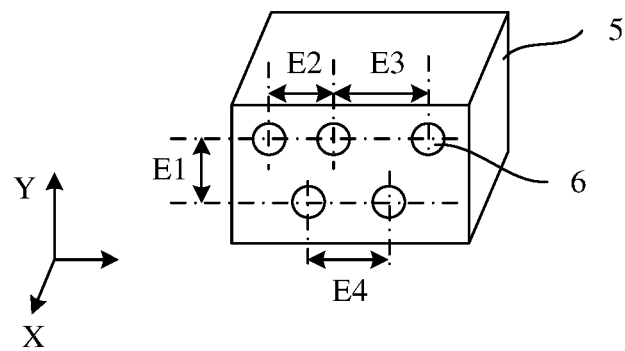

FIG. 3c shows still another possible distribution manner of carbon nanotubes 6. There are five carbon nanotubes 6, which are divided into an upper layer and a lower layer in a Y direction. A distance between the two layers of carbon nanotubes 6 is E1 (using an axis of the carbon nanotube 6 as a reference). In a Z direction, three carbon nanotubes 6 on the upper layer are disposed side by side, a distance between a first carbon nanotube 6 and a second carbon nanotube 6 from the left is E2 (using the axis of the carbon nanotube 6 as the reference), and a distance between the second carbon nanotube 6 and a third carbon nanotube 6 from the left is E3 (using the axis of the carbon nanotube 6 as a reference). Two carbon nanotubes 6 at the lower layer are disposed side by side, and a distance between the two carbon nanotubes 6 is E4 (using the axis of the carbon nanotube 6 as the reference). In this distribution, it is set that the direction Y is a column direction, and the direction Z is a row direction. In FIG. 3c, the carbon nanotubes 6 are aligned left and right in the row direction, and are mutually misaligned in the column direction. In addition, in the row direction, a distance between any two carbon nanotubes 6 is unequal.

Figure 3D:
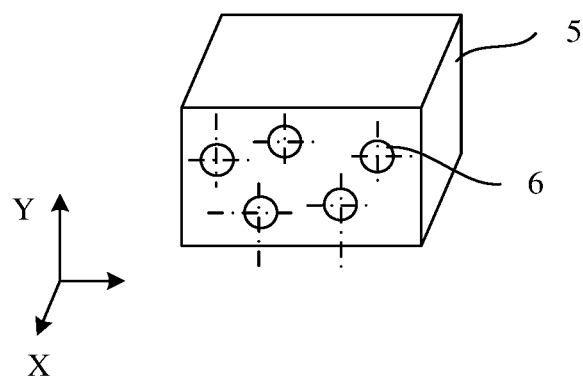

FIG. 3d shows yet another possible distribution manner of carbon nanotubes 6. There are five carbon nanotubes 6, and in a Y direction or a Z direction, the carbon nanotubes 6 have no specific arrangement rule using an axis of the carbon nanotube 6 as a reference. In this distribution, the direction Y is set as a column direction, Z is set as a row direction, and the carbon nanotubes 6 in FIG. 3d are mutually misaligned.

It should be understood that FIG. 3a to FIG. 3d show several possible distribution manners of carbon nanotubes 6 in the channel layer 5. A same point lies in that in each manner, a plurality of carbon nanotubes 6 are parallel to each other, that is, axis directions of all carbon nanotubes 6 are parallel to the X direction (a direction from the source 2 to the drain 3 or a direction from the drain 3 to the source 2). However, it should be noted that the carbon nanotubes 6 shown in FIG. 3a and FIG. 3b are distributed in an array, and in preparation of the carbon nanotubes 6, the carbon nanotubes 6 may be prepared in batch, thereby reducing complexity of a preparation process. However, the distribution manners of the carbon nanotubes 6 shown in FIG. 3c and FIG. 3d are irregular, and a relatively complex preparation process may be needed in preparation of the carbon nanotubes 6.

In the foregoing field effect transistor structure, electron conduction is implemented between the source 2 and the drain 3 by using the carbon nanotube 6, so that the field effect transistor has a wider channel. In other words, the field effect transistor has stronger performance and a larger drive current. Herein, the carbon nanotube 6 is in a shape of a tiny cylinder formed by arranging carbon atoms, which facilitates component miniaturization.

The distribution status of the carbon nanotubes 6 shown in FIG. 3*a* in the channel layer 5 is used as an example. A structure of the channel layer 5 may be specifically shown in FIG. 4. The channel layer 5 includes at least one channel interlayer 51. For carbon nanotubes 6 distributed in an array in FIG. 3*a*, in the X direction, one channel interlayer 51 corresponds to one layer of carbon nanotubes 6, that is, in one channel interlayer 51, a layer of carbon nanotubes 6 distributed side by side is formed.

Figure 5:
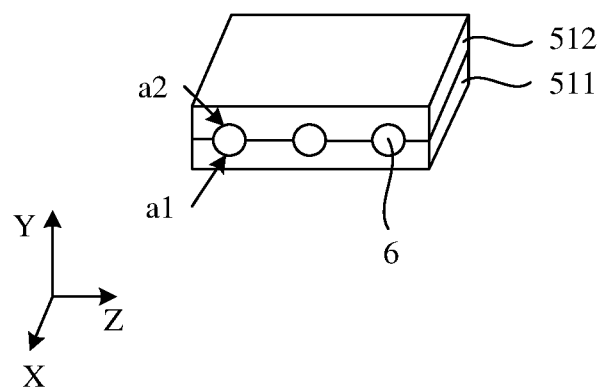
FIG. 5 is a schematic diagram of a structure of a channel interlayer in a field effect transistor according to an embodiment of this application.

For a structure of each channel interlayer 51, refer to FIG. 5. In a direction from the substrate structure 1 to the channel layer 5, the channel interlayer 51 includes a first oxide layer 511 and a second oxide layer 512 that are disposed opposite to each other. Herein, the first oxide layer 511 is closer to the substrate structure 1, and the second oxide layer 512 is closer to the gate 4. At least one first recess a1 may be formed on a surface that is of the first oxide layer 511 and that faces the second oxide layer 512. Correspondingly, second recesses a2 that are in a one-to-one correspondence to the first recesses a1 are formed on a surface that is of the second oxide layer 512 and that faces the first oxide layer 511. Each group of first recesses a1 and second recesses a2 that correspond to each other are matched to clamp one carbon nanotube 6. In FIG. 5, a row of parallel carbon nanotubes 6 is embedded in the channel interlayer 51. Therefore, a quantity of first recesses a1 and a quantity of second recesses a2 match a quantity of carbon nanotubes 6.

It should be understood that a structural state shown by the first oxide layer 511 and the second oxide layer 512 shown in FIG. 5 is a state finally presented by the field effect transistor, and is not used to limit a structural state of the channel layer 5 in a production and preparation process. In other words, the first recess a1 and the second recess a2 may not exist in the preparation process, and are presented only after the first oxide layer 511 and the second oxide layer 512 clamp the carbon nanotube 6.

In a possible implementation, a material of the first oxide layer 511 and the second oxide layer 512 herein may be $SiO_2$. In actual production and preparation, the carbon nanotube 6 may be formed at the first recess a1 on the first oxide layer 511, and then the second oxide layer 512 is disposed on a side that is of the carbon nanotube 6 and that is away from the first oxide layer 511, so that the second oxide layer 512 covers the carbon nanotube 6. The first oxide layer 511 and the second oxide layer 512 surround the carbon nanotube 6 to obtain a structure as shown in FIG. 5.

It should be further noted that, in FIG. 5, the first oxide layer 511 and the second oxide layer 512 are shown in a relatively regular structure (similar to a cube). In actual production and preparation, the first oxide layer 511 and the second oxide layer 512 may be in an irregular state, and structures of the first oxide layer 511 and the second oxide layer 512 are related to one layer of carbon nanotubes 6 whose axes are on a same plane. Therefore, the structure of the finally obtained channel layer 5 only needs to match the structure of the channel region B between the source 2 and the drain 3.

Figure 6A:
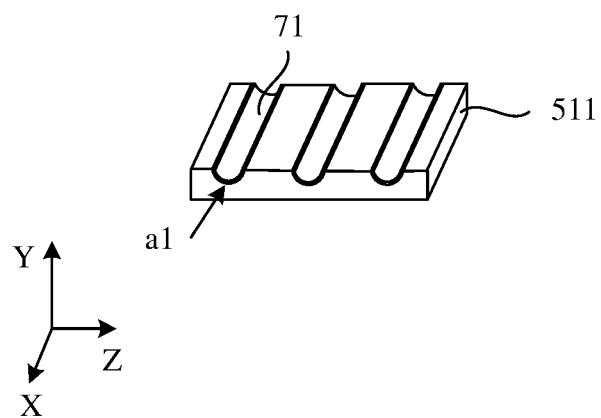
FIG. 6a and FIG. 6b are schematic diagrams of a structure of a first interlayer in a field effect transistor according to an embodiment of this application.
Figure 6B:
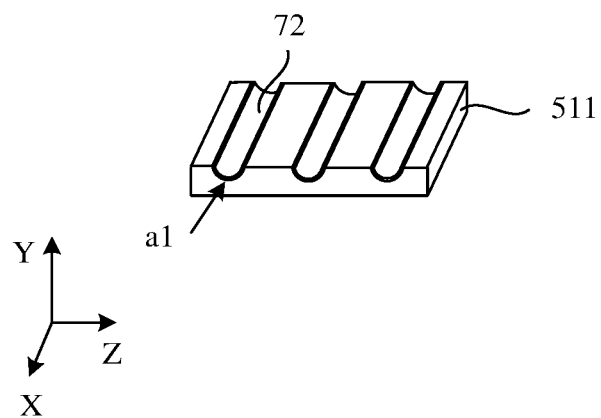

In a specific structure, as shown in FIG. 6*a*, a metal silicate compound 71 is formed on a surface that is of the first recess a1 on the first oxide layer 511 and that faces the carbon nanotube 6. The metal silicate compound 71 herein may be distributed on the surface of the first recess a1 in a form of a film layer, that is, the carbon nanotube 6 is formed on the metal silicate compound 71, and in other words, the carbon nanotube 6 is surrounded by the metal silicate compound 71 and the second oxide layer 512. In another specific structure, as shown in FIG. 6*b*, a metal oxide 72 is formed on a surface that is of the first recess a1 on the first oxide layer 511 and that faces the carbon nanotube 6. The metal oxide 72 herein may be distributed on the surface of the first recess a1 in a form of a film layer, that is, the carbon nanotube 6 is formed on the metal oxide 72, and in other words, the carbon nanotube 6 is surrounded by the metal oxide 72 and the second oxide layer 512. Both the metal silicate compound 71 and the metal oxide 72 herein facilitate formation of the carbon nanotube 6.

It may be understood that, when the metal silicate compound 71 or the metal oxide 72 covers the surface that is of the first recess a1 and that faces the carbon nanotube 6 as shown in FIG. 6*a* or FIG. 6*b*, formation of the carbon nanotube 6 is facilitated.

Figure 7:
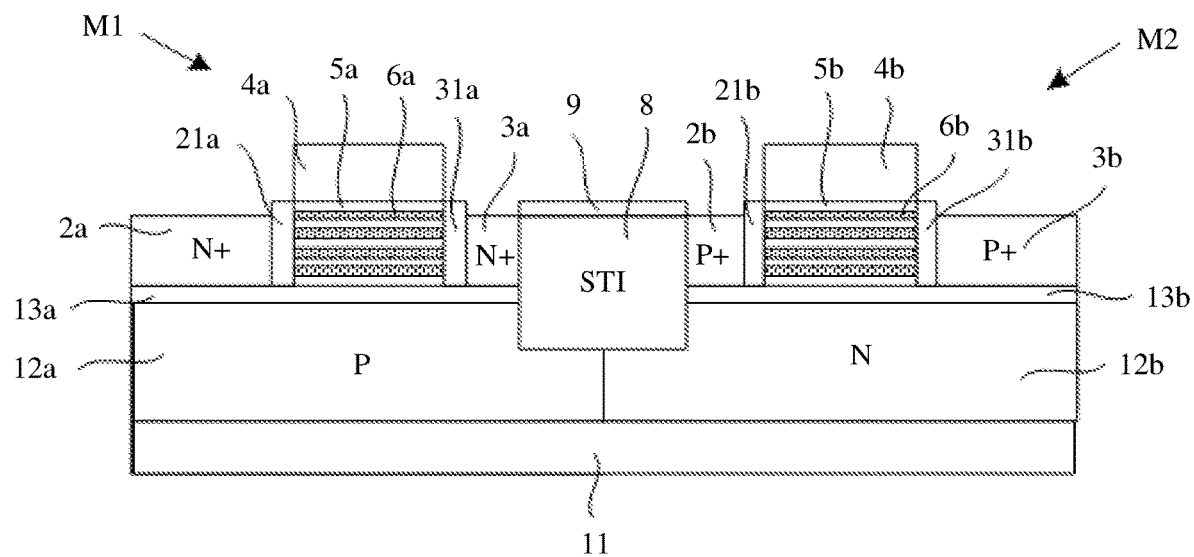
FIG. 7 is a schematic diagram of a structure of a semiconductor structure according to an embodiment of this application.

Based on the structure of the field effect transistor shown in FIG. 2*d*, this application further provides a semiconductor structure. As shown in FIG. 7, the semiconductor structure includes two field effect transistors (which are respectively shown by using a field effect transistor M1 and a field effect transistor M2). The two field effect transistors share one silicon substrate 11, and other structures of the two field effect transistors are separately disposed. Specifically, as shown in FIG. 7, the field effect transistor M1 includes a P well 12*a* formed on the silicon substrate 11. An insulation layer 13*a* is formed on a side that is of the P well 12*a* and that is away from the silicon substrate 11. An N-type source 2*a* and an N-type drain 3*a* of the field effect transistor M1 are disposed on the insulation layer 13*a*. A channel layer 5*a* is disposed between the source 2*a* and the drain 3*a*. N carbon nanotubes 6*a* (N is an integer greater than or equal to 1, and N is greater than 1 in FIG. 7) distributed in parallel are embedded in the channel layer 5*a*. A first contact layer 21*a* is disposed between the channel layer 5*a* and the source 2*a*, and a second contact layer 31*a* is disposed between the channel layer 5*a* and the drain 3*a*. Two ends of the carbon nanotube 6*a* are respectively connected to the first contact layer 21*a* and the second contact layer 31*a*, to implement electron conduction between the source 2*a* and the drain 3*a*. Correspondingly, the field effect transistor M2 includes an N well 12*b* formed on the silicon substrate 11. An insulation layer 13*b* is formed on a side that is of the N well 12*b* and that is away from the silicon substrate 11. A P-type source 2*b* and a P-type drain 3*b* of the field effect transistor M2 are disposed on the insulation layer 13*b*. A trench layer 5*b* is disposed between the source 2*b* and the drain 3*b*. N carbon nanotubes 6*b* (N is an integer greater than or equal to 1, and N is greater than 1 in FIG. 7) distributed in parallel are embedded in the channel layer 5*b*. A first contact layer 21*b* is disposed between the channel layer 5*b* and the source 2*b*, and a second contact layer 31*b* is disposed between the channel layer 5*b* and the drain 3*b*. Two ends of the carbon nanotube 6*b* are respectively connected to the first contact layer 21*b* and the second contact layer 31*b*, to implement electron conduction between the source 2*b* and the drain 3*b*.

Still refer to FIG. 7. The two field effect transistors are isolated by using shallow trench isolation (STI, shallow trench isolation), that is, a spaced trench is formed between the two field effect transistors, the trench is filled with an isolator through deposition to form an isolation part 8, and a second protective layer 9 is further formed on the isolation part 8.

Figure 8:
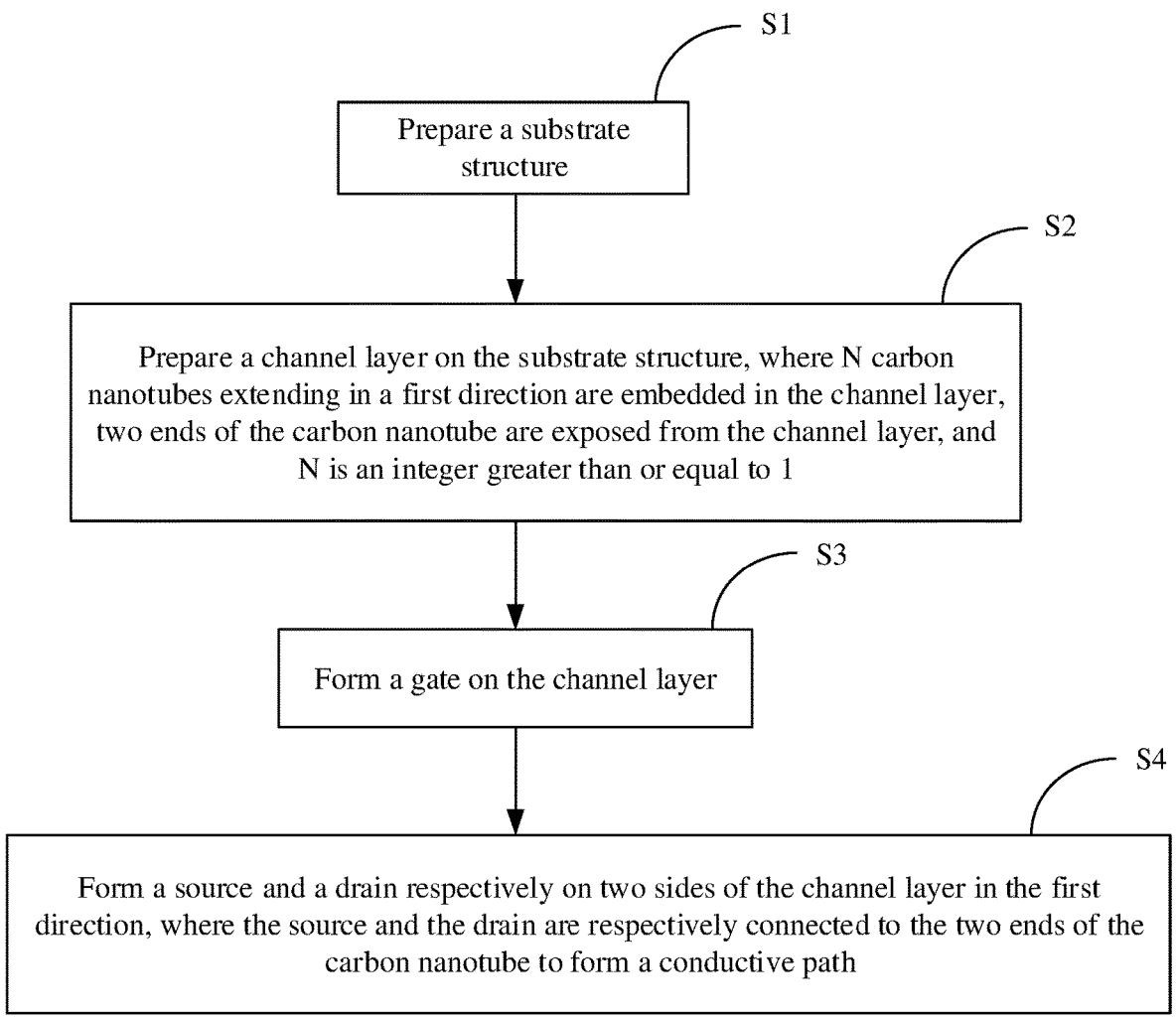
FIG. 8 is a schematic flowchart of a preparation method for a field effect transistor according to an embodiment of this application.

The structure of the field effect transistor shown in FIG. 2*a* is used as an example. An embodiment of this application further provides a preparation method for a field effect transistor. For a specific preparation procedure of the field effect transistor, refer to FIG. 8. The method includes the following steps.

S1: Prepare a substrate structure 1, where it should be understood that the substrate structure 1 herein is merely used as an example of a bottom structure of the field effect transistor.

S2: Prepare a channel layer 5 on the substrate structure 1, where N carbon nanotubes 6 extending in a first direction are embedded in the channel layer 5, and N is an integer greater than or equal to 1; and expose two ends of the carbon nanotube 6 from the channel layer 5, where it should be understood that, that two ends of the carbon nanotube 6 are exposed from the channel layer 5 herein means that the ends of the carbon nanotube 6 are not covered by the channel layer 5 at least, and the ends of the carbon nanotube 6 may be flush with a surface of the channel layer 5, or the carbon nanotube 6 protrudes from the surface of the channel layer 5.

S3: Form a gate 4 on the channel layer 5.

S4: Form a source 2 and a drain 3 respectively on two sides of the channel layer 5 in the first direction, where the source 2 and the drain 3 are respectively connected to the two ends of the carbon nanotube 6 to form a conductive path, so as to implement current conduction between the source 2 and the drain 3.

Figure 9:
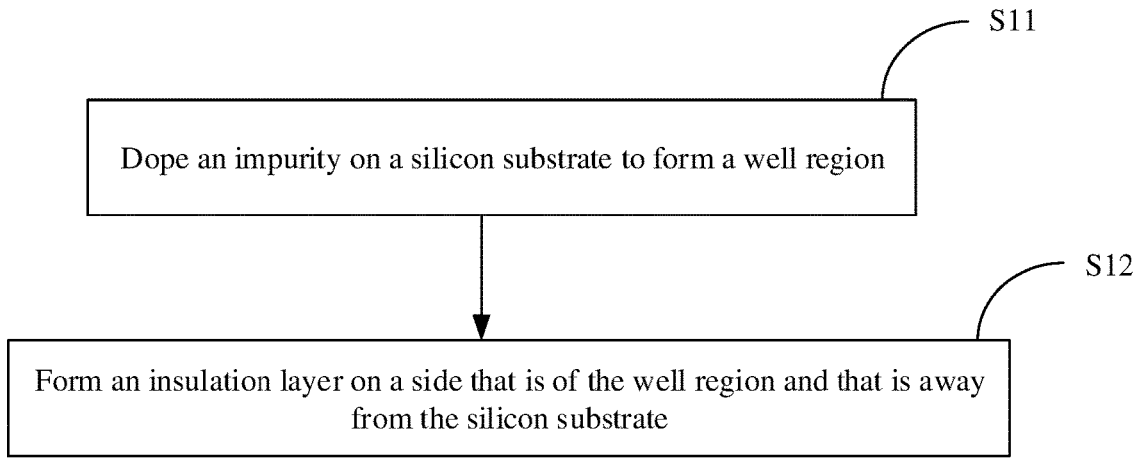
FIG. 9 is a schematic flowchart of a preparation method for a substrate structure in a field effect transistor according to an embodiment of this application.

When the substrate structure 1 herein includes a silicon substrate 11 and a well region 12, and the well region 12 is formed by doping an impurity on the silicon substrate 11, step S1 is specifically shown in FIG. 9, and includes the following step.

S11: Dope an impurity on the silicon substrate 11 to form a well region 12. When the well region 12 herein is a P well, a trivalent element (for example, boron) is doped on the silicon substrate 11 to form a P well; and when the well region 12 herein is an N well, a pentavalent element (for example, phosphorus) is doped on the silicon substrate 11 to form the N well.

When the substrate structure 1 further includes an insulation layer 13 formed on the side that is of the well region 12 and that is away from the silicon substrate 11, after the foregoing step S11, the following step is further included.

S12: Form the insulation layer 13 on a side that is of the well region 12 and that is away from the silicon substrate 11.

According to the distribution manners of the carbon nanotubes 6 in the channel layer 5 shown in FIG. 3a to FIG. 3d, structures of the channel layer 5 and the carbon nanotubes 6 may be divided for layer-by-layer structure preparation by using one channel interlayer 51 as a unit. For each channel interlayer 51, at least one carbon nanotube 6 is embedded in the channel interlayer 51. When a quantity of carbon nanotubes 6 is greater than or equal to two, all the carbon nanotubes 6 are parallel, and axes of the carbon nanotubes 6 are located on a same plane.

Figure 4:
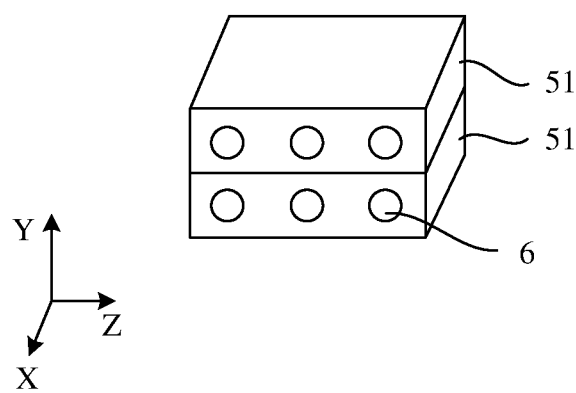
FIG. 4 is a schematic diagram of a structure of a channel layer in a field effect transistor according to an embodiment of this application.
Figure 10:
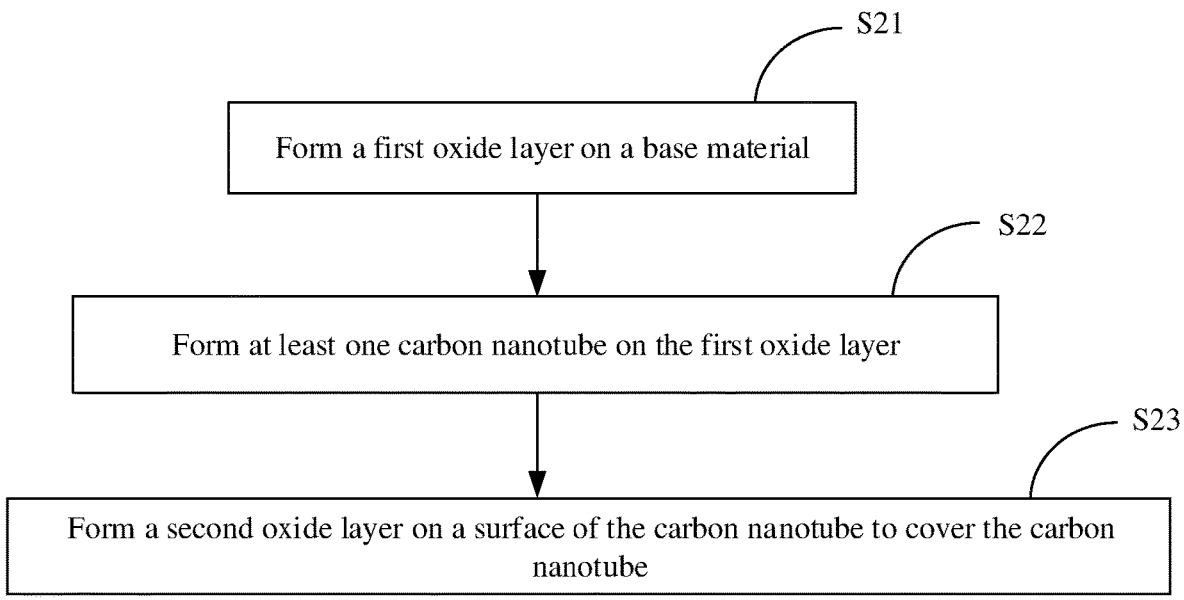
FIG. 10 is a schematic flowchart of a preparation method for a channel interlayer in a field effect transistor according to an embodiment of this application.

Based on this, the structure shown in FIG. 4 is used as an example. Refer to FIG. 10. The preparing a channel layer 5 on the substrate structure 1 in step S2 includes the following steps performed at least once.

S21: Form a first oxide layer 511 on a base material, where the base material herein is a structure used by the substrate structure 1 to form a side of the channel layer 5, when the channel interlayer 51 is a first channel interlayer 51 in contact with the substrate structure 1, the base material herein refers to the substrate structure 1, and when the channel interlayer 51 refers to a channel interlayer 51 above another channel interlayer 51, the base material herein refers to the previously formed channel interlayer 51.

S22: Form at least one carbon nanotube 6 on the first oxide layer 511, where when a quantity of carbon nanotubes 6 is greater than or equal to 2, the carbon nanotubes 6 are parallel to each other. It should be understood that the first recess a1 shown in FIG. 5 is formed on the first oxide layer 511, and the carbon nanotube 6 is formed at the first recess a1.

S23: Form a second oxide layer 512 on a surface of the carbon nanotube 6 to cover the carbon nanotube 6, so as to finally obtain the channel interlayer 51, shown in FIG. 5, in which one layer of carbon nanotubes 6 on the same plane is embedded.

It may be understood that the first oxide layer 511 and the second oxide layer 512 herein have at least the following several possible implementations.

Implementation 1: The first oxide layer 511 may be $SiO_2$ and the second oxide layer 512 may also be $SiO_2$, and the carbon nanotube 6 may be directly formed on the first oxide layer 511.

Implementation 2: The first oxide layer 511 may be $SiO_2$, a metal silicate compound 71 is formed at a location at which the first oxide layer 511 is used to form the carbon nanotube 6, and the carbon nanotube 6 is formed on the metal silicate compound 71. Based on this, as shown in FIG. 11, after step S21 and before step S23, the method may further include the following step.

S211: Prepare a metal oxide on the first oxide layer 511, so that the metal oxide reacts with the first oxide layer 511 to form the metal silicate compound 71. When the first oxide layer 511 is $SiO_2$, the metal oxide may be $Al_2O_3$. Herein, $Al_2O_3$ may be specifically injected into $SiO_2$ by sputtering. $Al_2O_3$ reacts with $SiO_2$ to form a metal silicate compound $Al_2SiO_5$ or $Al_2O_3$. $SiO_2$ with a thickness level of nm.

Figure 11:
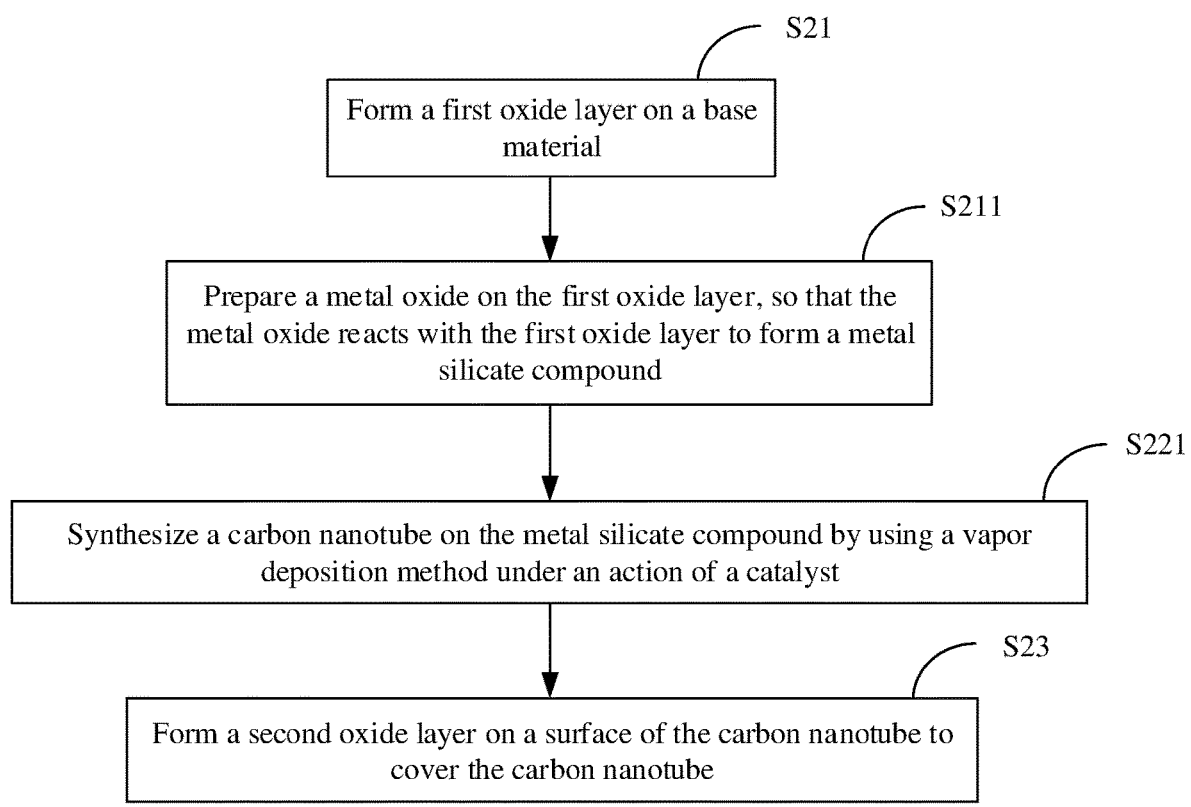
FIG. 11 is a schematic flowchart of a preparation method for a field effect transistor according to an embodiment of this application.

Based on this, as shown in FIG. 11, the forming at least one carbon nanotube 6 on the first oxide layer 511 in step S22 may be specifically implemented in the following step.

S221: Under the action of a catalyst, synthesize the carbon nanotube 6 on the metal silicate compound 71 by using a vapor deposition method, where the catalyst herein may be tungsten-based alloy nanocrystalline, and the specific process is as follows: By using a cluster molecule of a carbon-philic metal (for example, a metal containing tungsten) and another transition metal element as a start material on the metal silicate compound 71, prepare a tungsten-based alloy nanocrystalline catalyst under a relatively mild condition, and then synthesize the carbon nanotube 6 by alcohol chemical vapor deposition.

Implementation 3: The first oxide layer 511 may be $SiO_2$, a metal oxide 72 is formed at a location at which the first oxide layer 511 is used to form the carbon nanotube 6, and the carbon nanotube 6 is formed on the metal oxide 72. Based on this, as shown in FIG. 12, after step S21 and before step S23, the method may further include the following step.

S212: Add metal to the first oxide layer 511 to form the metal oxide 72. Herein, a metal adding process may use evaporation and photoetching. When the metal is Al, Al is added to the first oxide layer 511 by evaporation and photoetching, and Al may be naturally oxidized in air to form the metal oxide 72 ($Al_2O_3$) with a thickness level of nm.

Figure 12:
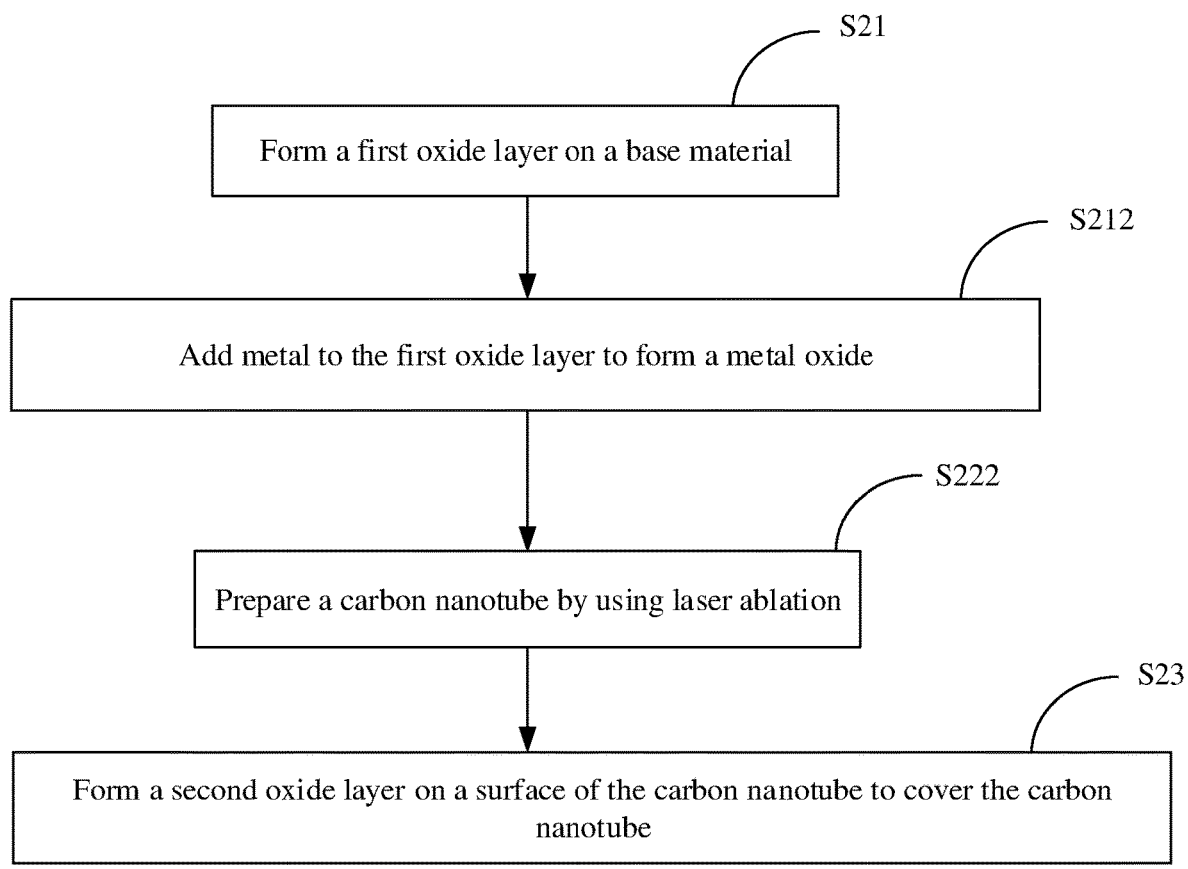
FIG. 12 is a schematic flowchart of a preparation method for a field effect transistor according to an embodiment of this application.

Based on this, as shown in FIG. 12, the forming at least one carbon nanotube 6 on the first oxide layer 511 in step S22 may be specifically implemented in step S222.

S222: Prepare the carbon nanotube 6 by using laser ablation.

Figure 13:
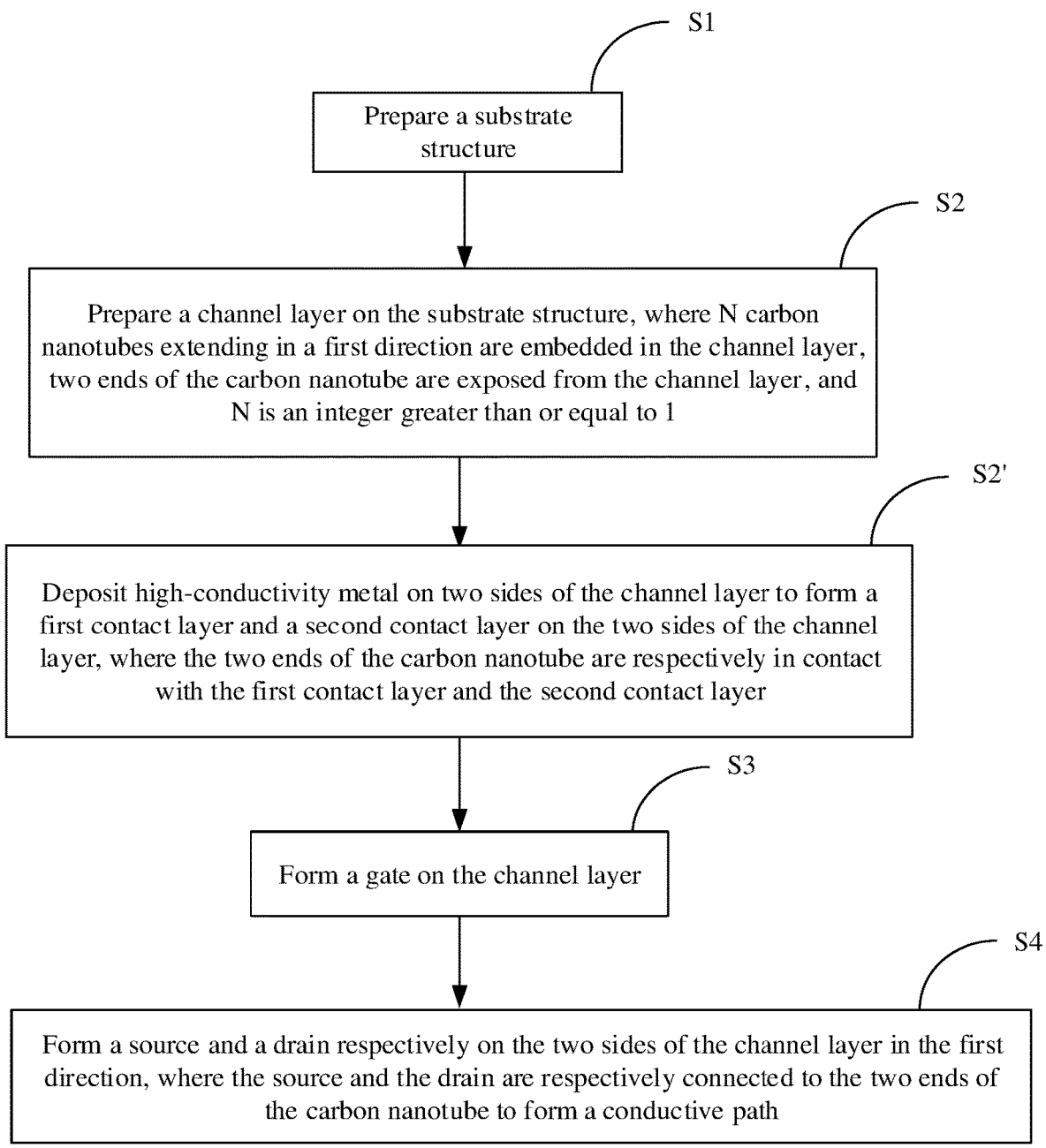
FIG. 13 is a schematic flowchart of a preparation method for a field effect transistor according to an embodiment of this application.

Based on the structure of the field effect transistor shown in FIG. 2b, after step S2 and before step S3, as shown in FIG. 13, the method further includes the following step.

S2': Deposit high-conductivity metal on the two sides of the channel layer 5 to form a first contact layer 21 and a second contact layer 31 on the two sides of the channel layer 5, where one end of the carbon nanotube 6 is electrically connected to the source 2 through the first contact layer 21, and the other end of the carbon nanotube 6 is electrically connected to the drain 3 through the second contact layer 31. Herein, a process of depositing high-conductivity metal on two sides (refer to two sides in a first direction) of the channel layer 5 may use electron beam lithography. It should be understood that the first contact layer 21 and the second contact layer 31 may be prepared separately or simultaneously according to a specific process during production.

Based on step S2', during specific implementation of step S4 in FIG. 13, the source 2 is connected to one end of the carbon nanotube 6 through the first contact layer 21, and the drain 3 is connected to the other end of the carbon nanotube 6 through the second contact layer 31, so as to implement a circuit connection between the source 2, the carbon nanotube 6, and the drain 3 to form a conductive path.

Figure 14:
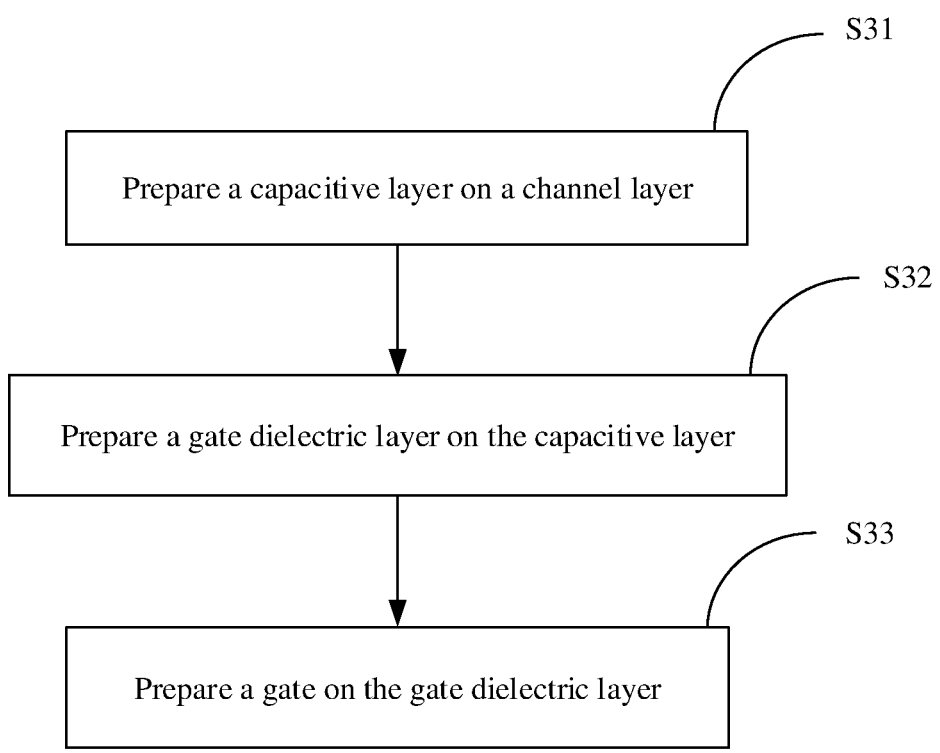
FIG. 14 is a schematic flowchart of a preparation method for a gate in a field effect transistor according to an embodiment of this application.

When the capacitive layer 41 and the gate dielectric layer 42 are further stacked between the gate 4 and the channel layer 5 of the field effect transistor, as shown in FIG. 14, the foregoing step S3 includes the following steps.

S31: Prepare the gate dielectric layer 42 on the channel layer.

S32: Prepare the capacitive layer 41 on the gate dielectric layer 42.

S31: Prepare the gate 4 on the capacitive layer 41.

It should be understood that a first protective layer 43 may be further covered on a surface of a structure including the gate 4, the capacitive layer 41, and the gate dielectric layer 42, to protect the structure.

The foregoing descriptions are merely specific implementations of this application, but are not intended to limit the protection scope of this application. Any variation or replacement readily figured out by a person skilled in the art within the technical scope disclosed in this application shall fall within the protection scope of this application. Therefore, the protection scope of this application shall be subject to the protection scope of the claims.

What is claimed is:

1. A field effect transistor, comprising: a substrate structure, a source, a drain, and a gate, wherein:
    the source and the drain are arranged on the substrate structure in a first direction, and a channel region is formed between the source and the drain;
    a channel layer is formed in the channel region, N carbon nanotubes extending in the first direction are embedded in the channel layer, wherein N is an integer greater than or equal to 1, and two ends of each of the N carbon nanotubes are respectively connected to the source and the drain to form a conductive path, and wherein a first contact layer is disposed on a side that is of the source and that faces the channel layer, and a second contact layer is disposed on a side that is of the drain and that faces the channel layer; and
    the gate is formed on the channel layer.

2. The field effect transistor according to claim 1, wherein N is greater than or equal to 3, and the N carbon nanotubes are distributed in an array.

3. The field effect transistor according to claim 1, wherein the channel layer comprises at least one channel interlayer, each channel interlayer comprises a first oxide layer and a second oxide layer that are stacked in a direction from the substrate structure to the channel layer, and at least one carbon nanotube is embedded between the first oxide layer and the second oxide layer.

4. The field effect transistor according to claim 3, wherein a metal silicate compound is formed on a surface that is of the first oxide layer and that is in contact with the at least one carbon nanotube.

5. The field effect transistor according to claim 3, wherein a metal oxide is formed on a surface that is of the first oxide layer and that is in contact with the at least one carbon nanotube.

6. The field effect transistor according to claim 1, wherein one end of at least one of the N carbon nanotubes is connected to the source by using the first contact layer, and the other end of the at least one of the N carbon nanotubes is connected to the drain by using the second contact layer; and
    wherein conductivity of the first contact layer is higher than conductivity of the source, and conductivity of the second contact layer is higher than conductivity of the drain.

7. The field effect transistor according to claim 6, wherein a material of the first contact layer is gold or a gold alloy, and a material of the second contact layer is gold or a gold alloy.

8. The field effect transistor according to claim 1, wherein a capacitive layer and a gate dielectric layer are further stacked between the gate and the channel layer in a direction from the gate to the channel layer.

9. The field effect transistor according to claim 1, wherein the substrate structure comprises a silicon substrate and a well region formed on the silicon substrate.

10. The field effect transistor according to claim 9, wherein the substrate structure further comprises an insulation layer disposed on a side that is of the well region and that is away from the silicon substrate, and the source and the drain are located on the insulation layer.

11. A semiconductor structure, comprising two field effect transistors wherein the two field effect transistors are isolated from each other by using an isolator, and wherein each of the two field effect transistors comprises: a substrate structure, a source, a drain, and a gate, wherein:
    the source and the drain are arranged on the substrate structure in a first direction, and a channel region is formed between the source and the drain;
    a channel layer is formed in the channel region, N carbon nanotubes extending in the first direction are embedded in the channel layer, wherein N is an integer greater than or equal to 1, and two ends of each of the N carbon nanotubes are respectively connected to the source and the drain to form a conductive path, and wherein a first contact layer is disposed on a side that is of the source and that faces the channel layer, and a second contact layer is disposed on a side that is of the drain and that faces the channel layer; and
    the gate is formed on the channel layer.

12. A preparation method for a field effect transistor, comprising:
    preparing a substrate structure;
    preparing a channel layer on the substrate structure, wherein N carbon nanotubes extending in a first direction are embedded in the channel layer, two ends of each of the N carbon nanotubes are exposed from the channel layer, and N is an integer greater than or equal to 1;

forming a gate on the channel layer; and forming a source and a drain respectively on two sides of the channel layer, wherein the source and the drain are respectively connected to the two ends of the each of the N carbon nanotubes to form a conductive path, and wherein a first contact layer is disposed on a side that is of the source and that faces the channel layer, and a second contact layer is disposed on a side that is of the drain and that faces the channel layer.

13. The preparation method according to claim 12, wherein the preparing a channel layer on the substrate structure comprises performing the following steps at least once:

forming a first oxide layer on a base material, wherein the base material is a structure that is of the substrate structure and that is used to form a side of the channel layer;

forming at least one carbon nanotube on the first oxide layer; and forming a second oxide layer on a surface of the carbon nanotube to cover the carbon nanotube.

14. The preparation method according to claim 13, wherein after the forming a first oxide layer on a base material and before the forming at least one carbon nanotube on the first oxide layer, the method further comprises:

preparing a metal oxide on the first oxide layer, wherein the metal oxide reacts with the first oxide layer to form a metal silicate compound.

15. The preparation method according to claim 14, wherein the forming at least one carbon nanotube on the first oxide layer comprises:

synthesizing the carbon nanotube on the metal silicate compound by using a vapor deposition method under an action of a catalyst.

16. The preparation method according to claim 13, wherein after the forming a first oxide layer on a base material and before the forming at least one carbon nanotube on the first oxide layer, the method further comprises:

adding metal to the first oxide layer to form a metal oxide.

17. The preparation method according to claim 12, wherein one end of at least one of the N carbon nanotubes is connected to the source by using the first contact layer, and the other end of the at least one of the N carbon nanotubes is connected to the drain by using the second contact layer, wherein conductivity of the first contact layer is higher than conductivity of the source, and conductivity of the second contact layer is higher than conductivity of the drain; and before the preparing a channel layer in which at least one carbon nanotube is embedded on the substrate structure, and forming a gate on the channel layer, the method further comprises:

depositing high-conductivity metal on the two sides of the channel layer to form the first contact layer and the second contact layer on the two sides of the channel layer, wherein the two ends of the carbon nanotube are respectively connected to the first contact layer and the second contact layer.

18. The preparation method according to claim 12, wherein in a direction from the gate to the channel layer, a capacitive layer and a gate dielectric layer are further stacked between the gate and the channel layer, and the forming a gate on the channel layer comprises:

preparing the gate dielectric layer on the channel layer;

preparing the capacitive layer on the gate dielectric layer; and preparing the gate on the capacitive layer.

19. The preparation method according to claim 12, wherein the substrate structure comprises a silicon substrate and a well region formed on the silicon substrate, and the preparing a substrate structure comprises:

doping an impurity on the silicon substrate to form the well region.

20. The preparation method according to claim 19, wherein the substrate structure further comprises an insulation layer formed on a side that is of the well region and that is away from the silicon substrate, and after the doping an impurity on the silicon substrate to form the well region, the method further comprises:

forming the insulation layer on a side that is of the well region and that is away from the silicon substrate.

* * * * *